(12) United States Patent
Yoshinari et al.

(10) Patent No.: US 7,679,182 B2
(45) Date of Patent: Mar. 16, 2010

(54) POWER MODULE AND MOTOR INTEGRATED CONTROL UNIT

(75) Inventors: Hideto Yoshinari, Hitachinaka (JP); Yujiro Kaneko, Hitachinaka (JP); Masahide Harada, Yokohama (JP); Nobutake Tsuyuno, Tokai (JP); Shinichi Fujiwara, Kamakura (JP)

(73) Assignee: Hitachi, Ltd., Tokyo (JP)

( * ) Notice: Subject to any disclaimer, the term of this patent is extended or adjusted under 35 U.S.C. 154(b) by 83 days.

(21) Appl. No.: 11/936,158

(22) Filed: Nov. 7, 2007

(65) Prior Publication Data
US 2008/0106160 A1    May 8, 2008

(30) Foreign Application Priority Data
Nov. 8, 2006   (JP)   ............... 2006-302243

(51) Int. Cl.
| | |
|---|---|
| H01L 23/10 | (2006.01) |
| H01L 23/34 | (2006.01) |
| H01L 27/10 | (2006.01) |
| H01L 29/73 | (2006.01) |
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 23/495 | (2006.01) |
| H01L 23/52 | (2006.01) |

(52) U.S. Cl. .............. 257/706; 257/207; 257/341; 257/401; 257/675; 257/691; 257/712; 257/717; 257/E23.001; 257/E23.044; 257/E23.071; 257/E23.08; 257/E23.153

(58) Field of Classification Search ............. 257/207, 257/341, 401, 675, 691, 712, 717, E23.001, 257/E23.044, E23.071, E23.08, E23.153, 257/706
See application file for complete search history.

(56) References Cited

U.S. PATENT DOCUMENTS 5,440,169 A    8/1995   Tomita et al.

(Continued)

FOREIGN PATENT DOCUMENTS

JP    9-260550 A    10/1997

(Continued)

OTHER PUBLICATIONS

European Search Report dated Mar. 10, 2008 Seven (7) pages.

(Continued)

*Primary Examiner*—Ida M Soward
(74) *Attorney, Agent, or Firm*—Crowell & Moring LLP

(57) ABSTRACT

A power module includes a heat radiation layer having the first main surface and the second main surface of reverse side opposed to the first main surface, an insulation layer disposed on the first main surface of a radiation layer, a wiring portion of current circuit disposed on the insulation layer and a plurality of switching elements disposed on the insulation layer and electrically connected to the wiring portion of current circuit. A plurality of external terminals are electrically connected to the wiring portions of current circuit. Furthermore, the module has a resin sealing all of the insulation layer, a wiring portion for current circuit, switching elements and the first main surface of the radiation layer, and a resin sealing a portion of the second main surface of the radiation layer with the resin.

16 Claims, 6 Drawing Sheets

U.S. PATENT DOCUMENTS

| | | | | |
|---|---|---|---|---|
| 5,469,131 | A | * | 11/1995 | Takahashi et al. ............ 338/306 |
| 5,559,374 | A | * | 9/1996 | Ohta et al. .................... 257/723 |
| 5,641,944 | A | * | 6/1997 | Wieloch et al. ............. 174/252 |
| 5,703,399 | A | * | 12/1997 | Majumdar et al. .......... 257/723 |
| 5,747,875 | A | * | 5/1998 | Oshima ....................... 257/687 |
| 5,920,119 | A | * | 7/1999 | Tamba et al. ................ 257/718 |
| 5,942,797 | A | * | 8/1999 | Terasawa .................... 257/723 |
| 6,970,367 | B2 | * | 11/2005 | Takeshima et al. .......... 363/147 |
| 7,035,106 | B2 | * | 4/2006 | Youm et al. ................. 361/709 |
| 7,242,582 | B2 | * | 7/2007 | Kurauchi et al. ............ 361/704 |
| 7,445,081 | B2 | * | 11/2008 | Tominaga ................... 180/444 |
| 2006/0097380 | A1 | * | 5/2006 | Sato ............................ 257/706 |
| 2007/0257343 | A1 | * | 11/2007 | Hauenstein et al. ......... 257/676 |
| 2007/0257568 | A1 | * | 11/2007 | Akita et al. .................. 310/64 |
| 2008/0007925 | A1 | * | 1/2008 | Kariya et al. ............... 361/760 |

FOREIGN PATENT DOCUMENTS

| | | |
|---|---|---|
| JP | 2001-189325 A | 7/2001 |
| JP | 2003-031765 | 1/2003 |
| JP | 2003-31765 A | 1/2003 |

OTHER PUBLICATIONS

Japanese Office Action mailed May 12, 2009 and an English translation thereof.

\* cited by examiner

POWER MODULE AND MOTOR INTEGRATED CONTROL UNIT

CLAIM OF PRIORITY

This application claims priority from Japanese application serial No. 2006-302243, filed on Nov. 8, 2006, the content of which is hereby incorporated by reference into this application.

BACKGROUND OF THE INVENTION

The present invention relates to a power module, particularly to a power module of motor drive control improving its heat radiation performance suitable for home electric appliances, industrial devices and automobiles.

In traditional power modules having switching elements and used in various field, for example, MOSFET (Metal-Oxide Semiconductor Field Effect Transistor) and IGBT (Insulated Gate Bipolar Transistor) have been applied. The power module frequently has adopted a resin sealing structure to improve reliability of electric parts and productivity of modules. In such power modules of the resin seal structure, to improve heat radiating performance, a surface mounting the switching elements are covered with resin and a heat radiation layer of reverse side surface is exposed and makes surface contact to an external module mounting portion with grease or the like. Accordingly, a heat radiation path is insured to radiating heat generated inside of the switching elements to outside.

In the future, according to require a multi-function power module, high power and high mounting density, heat quantity of the power module is tendency to increase. With keeping reliability, by adopting such structure so as to keep heat radiation path, it is able to diffuse and radiate heat generated by the switching elements at the heat radiation layer and radiate heat efficiently to the module mounting portion with wide area.

For example, a resin sealed power module structure is disclosed in a patent document, Japanese laying open patent publication 2001-189325.

SUMMARY OF THE INVENTION

However, a traditional sealing structure of a power module seals only surface with resin where a switching element is mounted and the reverse side surface of the heat radiation layer is exposed. Therefore, it is well-known that warps are caused due to shrinking and hardening by hardening of the resin in manufacturing and resin shrinking at cooling, expansion and shrinking on the ambient temperature in practical use or the like.

Such warps generated in the power module results in decreasing reliability of electric parts inside the power module and heat radiating performance through expanding the gap between the reverse side surface of the radiation layer and a module mounting portion.

Accordingly, to resolve these problems, an object of the present invention is to propose a power module capable of maintaining reliability and productivity, as well as insuring of the heat radiation path.

A typical power module in the present invention comprises a heat radiation layer having a first main surface (upper surface) and a second main surface (reverse side surface) opposed to the first main surface, an insulation layer disposed on the first main surface of the heat radiation layer, a wiring portion for current circuit disposed on the insulation layer, a plurality of switching element disposed on the insulation layer and electrically connected to the wiring part for current circuit, a plurality of external terminals electrically connected to the wiring portion for current circuit and a resin sealing all of a insulation layer, the wiring portion for current circuit, the switching elements, the first main surface of the heat radiation layer and a portion of the second main surface of the heat radiation layer.

Further, the other typical motor integrated control unit of the present invention comprises a motor, a power module mounting portion formed with metal and arranged on the motor, a power module to flow current for driving the motor and mounted to the power module mounting portion, a bus bar wiring board connected to the external terminal for conducting large current extending from the power module and mounted at upper portion of the power module, a resin circuit board transmitting a control signal to the power module, wherein, the power module is covered with a resin and having a plurality of switching elements for driving motor inside of the resin, the plurality of switching elements are disposed on the heat radiation layer through an insulation layer, the reverse side surface of the heat radiation layer has an exposure region exposed to outside and the non-exposure region covered with the resin, and the heat radiation layer is connected to the power module mounting portion in the exposure region.

DETAILED EXPLANATION OF THE PREFERRED EMBODIMENTS

An embodiment of the present invention is explained referring to drawings below.

Figure 1:
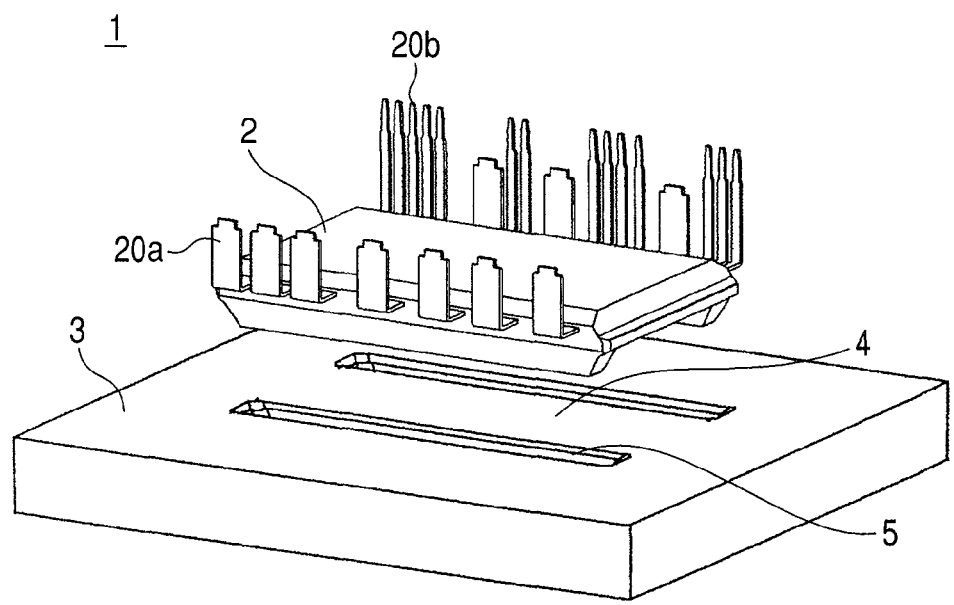
FIG. 1 is a whole perspective view before mounting the power module to fix the module mounting portion in the first embodiment.
Figure 2:
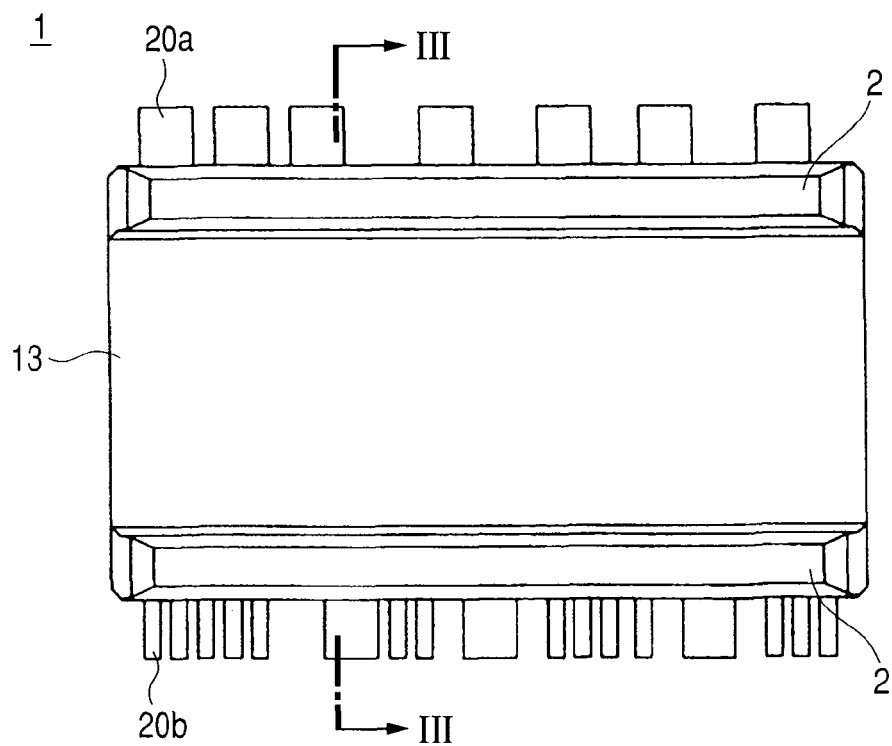
FIG. 2 is a back view showing the power module.
Figure 3:
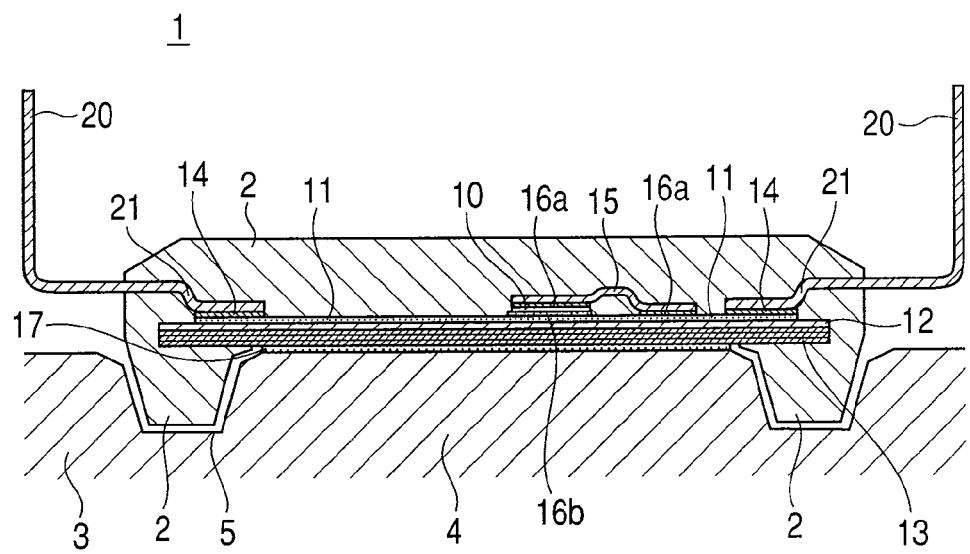
FIG. 3 is a sectional view along line III-III of FIG. 2 showing the power module condition after mounted to the module mounting portion 3.

FIG. 1 to FIG. 3 show an appropriate structure of the power module as an embodiment of the present invention. FIG. 1 is a whole perspective view of the present embodiment before mounting a power module 1 on the power module mounting portion 3. FIG. 2 is a back view of the power module 1 shown in FIG. 1. FIG. 3 is a sectional view taken along line III-III in FIG. 2 after mounting the power module 1 on the power module mounting portion 3.

As shown in FIG. 1 to FIG. 3, the power module 1 of the present embodiment has a laminated structure which comprises a plurality of switching elements 10 for driving and controlling a external motor (not shown), a wiring portion of current circuit mounting a plurality of switching elements 10, an insulation layer 12 consisting of an insulation material, and a heat radiation layer 13 diffusing and radiating heat from a plurality of switching elements 10.

The switching element 10 is a power semi-conductor element such as MOSFET or IGBT or the like. Also, the switching element 10 is a bear chip on which a silicon chip is mounted with exposed condition.

An electrode pad is disposed at both ends of upper surface and reverse side surface of the switching element 10. The electrode pad of the reverse side surface and the wiring portion for current circuit 11 are connected each other using a lead free solder 16b. Such chip structure is capable of decreasing mounting area of the switching element 10 and size of the power module 1.

Furthermore, an electrode pad of the reverse side surface of the switching element 10 is connected to the wiring portion for current circuit 11 by lead free solder with high thermal conductivity and superior environment performance.

Accordingly, it is able to diffusing and radiating generated heat from the switching element 10 to the reverse side surface of the power module 1 with high efficiency.

In addition, both of the electrode pads of the upper surface and the wiring portion for current circuit 11 are connected with lead free solder 16a through conductive stripe shaped bridge member 15. The conductive stripe shaped bridge member 15 is made of cupper alloy material. It is preferable to use as the cupper alloy material, for example, tough pitch copper material and oxygen free cupper material with high thermal conductivity, low thermal expansion coefficient and low electric resistance coefficient. However, without limiting these materials, it is able to use cupper-molybdenum alloy material, cupper-tungsten alloy material or the like in comparison with the other metal material having a very low thermal expansion coefficient.

As described above, using a stripe shaped bridge member 15 having high thermal conductivity, low thermal expansion coefficient and low electric resistance coefficient is able to efficiently prevent self-heating of the stripe shaped bridge member 15 when conducting large current.

Also, at least a portion of electrical pads on the surface of the switching elements 10 uses lead free solder with high thermal conductivity and well environment performance and is connected to the wiring portion for current circuit 11 through the conductive stripe shaped bridge member 15. As a result, it is able to diffuse heat of the switching element 10 from the upper surface of the switching element 10 effectively to the reverse side surface of the power module 1.

In addition, the wiring portion for current circuit 11 consists of a material having high thermal conductivity and low electric resistance such as cupper alloy or the like. The wiring thickness of the wiring portion for current circuit 11 is over 100 μm, preferable to 100 μm-175 μm.

Such structure is capable of diffusing and radiating effectively heat of the switching element 10 to the reverse side surface of the power module 1. Also, it is able to prevent heating of the wiring itself when flowing large current.

Material having high thermal conductivity and well electric insulation is used as the insulation layer 12. For example, aluminum oxide material, silicon nitride material, aluminum nitride material, or alumna powder inserted epoxy resin material having high thermal conductivity, or the like are used. Using material having the high thermal conductivity and a well electric insulation is capable of insuring electric insulation performance between the wiring portion for current circuit 11 and the heat radiation layer 13, and diffuse and radiate heat from the switching elements 10 to the reverse side surface of the power module 1 efficiently.

As the radiation layer 13, for example, it is preferable to use a material having high thermal conductivity and low thermal expansion coefficient comparing with other metal material, such as tough pitch cupper material and oxygen free cupper material. However, without limiting to these materials, it is able to use aluminum alloy and light specific gravity or cupper-molybdenum alloy material having very low thermal expansion coefficient performance, cupper-tungsten alloy material, or alumna silicon carbide having high thermal conductivity comparing with other materials. Adopting such materials with high thermal conductivity is capable of diffusing and radiating the heat from the switching element more efficiently to the power module reverse side surface.

Figure 4:
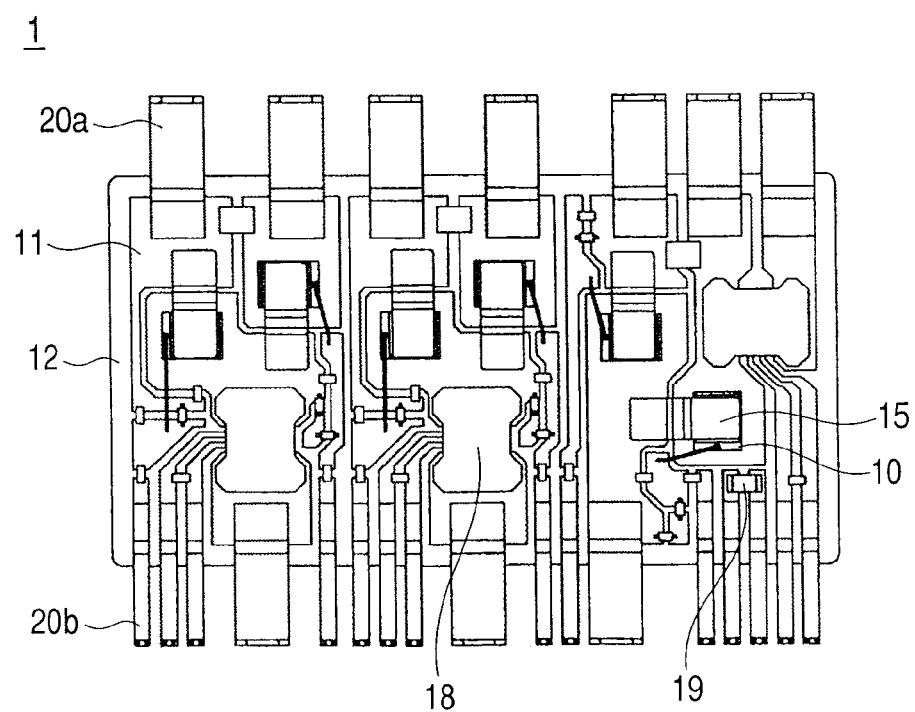
FIG. 4 is a vertical front view of the power module before resin sealing in the first embodiment.

FIG. 4 is a view showing a power module structure of the power module 1 of the present embodiment before the resin sealing process.

In addition to a plurality of switching elements 10 and an external terminal 20 having L-shaped section, a current sensing resistance element 18 and a temperature sensing element 19 are mounted on the wiring portion for current circuit 11 of the power module 1. Including these elements, a control circuit for driving motor is constituted.

Figure 5:
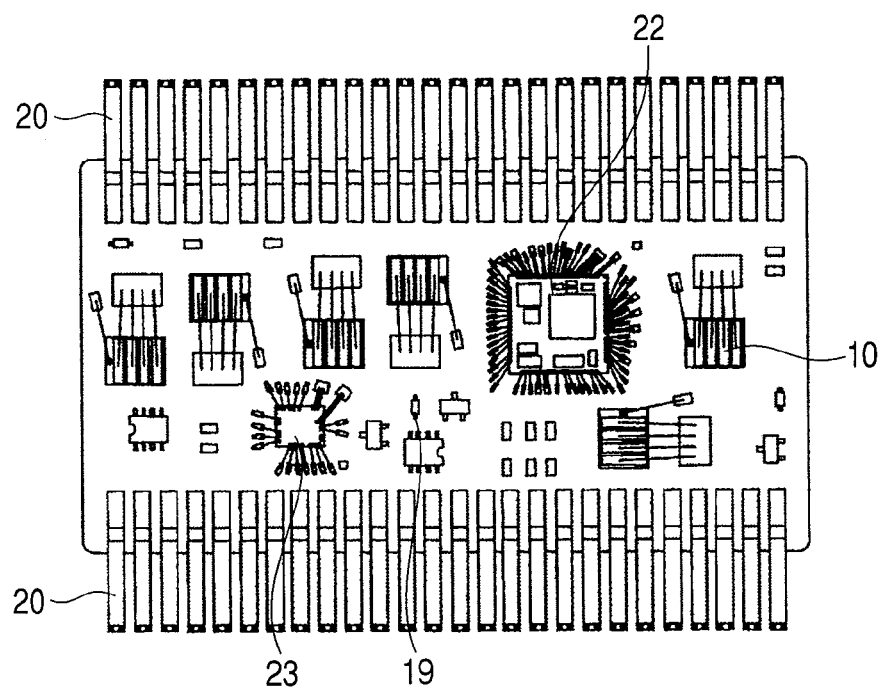
FIG. 5 is a vertical front view of the power module before resin sealing in other practical modes in accordance with the present invention.

FIG. 5 shows the other power module structure of the power module 1 of the present embodiment in the previous step of the resin sealing.

Different from the structure as shown in FIG. 4, in addition to a plurality of switching elements 10 and the external terminal 20 having L-shaped section, a micro-computer 22 for controlling and supervising the switching elements 10 and an element 23 instituting a power source circuit are mounted on the wiring portion of current circuit 11 of the power module 1. As described above, a circuit structure integrating a power circuit and control circuit may be adopted.

As shown in FIG. 1 to FIG. 3, all of upper surface of the power module 1 and side surface mounting the switching elements 10 are sealed by a hardening type resin 2.

On the other hand, while a reverse side surface of the radiation layer 13 disposed on the reverse side surface of the power module 1 is covered with the resin 2 at both ends of the longer sides, its central portion and both ends of the shorter sides is not covered with the resin 2. Therefore, the reverse side surface of the heat radiation layer 13 has a structure in which a portion except both ends of the longer sides is exposed to outside.

By sealing both ends of the longer sides of power module 1 with the resin 2, the reverse side surface of resin 2 and the reverse side surface of the heat radiation layer 13 form a structure having a plane with height different from each other in the power module 1.

As explained, through exposing at least not only the upper and lower surfaces of the power module 1 but also a portion of the radiation layer 13 of the lower surface of the power module 1 is exposed and seals the lower surface of the power module so as to be a plane different from the reverse side surface of the power module 1 in height, it is able to decrease difference between expansion quantity and shrinking one of the resin 2 on the reverse side surface of power module 1.

Also, it is able to suppress extremely warp of the power module due to hardening and shrinking during manufacturing of the power module 1, resin shrinking at cooling, expansion and shrinking at ambient temperature in practical use. As a result, with keeping reliability, insuring the radiation path may be possible.

An exposure portion of the radiation layer 13 disposed on the reverse side surface of the power module, or a portion sealed with thin resin 2 is preferable to be formed to arrange the switching elements 10 at its center portion. Such structure may arrange the exposure portion or a portion with the thin resin seal so as to position the switching elements 10 in the minimum range as center. As a result, it is able to suppress efficiently the warp of all power modules 1 and to improve reliability to insure efficiently the radiation path.

Also, instead of the exposed portion to the central portion of reverse side surface of the heat radiation layer 13 disposed at the reverse side surface of the power module 1, for example, a structure sealed with thinner resin may be adopted. Such structure is able to obtain same effect as that above described. Further, the structure that reverse side surface of the radiation layer 13 is sealed enable to improve the anti-corrosion performance of the heat radiation layer 13 in comparison with the structure that the reverse side surface is exposed.

A salient 4 is provided with the power module mounting portion 3 for mounting the power module coinciding with the exposure shape of the heat radiation layer 13 of the power module 1. The reverse side surface of radiation layer 13 of power module 1 is adhered to the salient 4 of the power module mounting portion 3 through grease 17. The power module mounting portion 3 is preferable to be formed with a metal or the like having well heat radiating performance.

Additionally, an accommodating portion 5 to accommodate the sealing resin 2 which seals an end surface of the longer sides of the heat radiation layer 13 of the power module 1 is placed at the power module mounting portion 3. The resin 2 is projected from the plane of the heat radiation layer 13 in the reverse side surface of the power module 1. Therefore, the accommodation portion 5 disposed at the power module mounting portion 3 is so structured as to accommodate the salient portion projected from the heat radiation layer 13 in the resin 2 of the power module 1.

A plurality of the external terminals 20 of cupper alloy products having a L-shaped section to drive and control the motor is provided with the power module 1. The surface of the external terminal 20 is plated, for example, Sn plating or Sn—Bi plating considering solder wetting performance and connection strength.

Two kinds of terminals, an external terminal 20a for conducting large current and an external terminal 20b for transmitting signals are provided with a power module 1 as external terminals 20. Large current for motor driving flows in the external terminal 20a for conducting large current from the external power source through the switching elements 10.

In addition, a control signal to control ON/OFF for controlling current flowing through the motor is input to the external terminal 20b for transmitting signal to transfer to control terminal switching element 10. That is, the large current for driving motor flows based on the control signal input by external terminal 20b for signal conducting through the external terminal for conducting large current 20a.

As large current for motor driving flows through the external terminal 20a for conducting large current, its width is selected to be larger than that of the external terminal 20b of the signal transmitting. However, in consideration of amount of the current for motor diving, the external terminal 20 for conducting large current and the external terminal 20b for transmitting signals may be set to same size and shape.

Also, in the present embodiment, an external terminals 20a for conducting large current are disposed at both sides of the longer sides of power module 1. On the other hand, an external terminal 20b for transmitting signal is disposed at only one of the longer sides. However, the present invention is not limited to such structure and capable of changing appropriately considering influences of heat, noise and the like.

Both of the external terminal 20a for conducting large current and the external terminal 20b for transmitting signal are connected each other using lead free solder to a connection portion 14 disposed on the wiring portion of current circuit 11. As the lead free solder, Sn—Cu solder, Sn—Ag—Cu solder, Sn—Ag—Cu—Bi solder, or the like are used, however, there is no necessary to limit to them.

The external terminal 20a for conducting large current and the external terminal 20b for signal transmitting have a step portion 21 at a connection portion 14. By the step portion 21, distance between the insulation layer 12 and the external terminal 20 becomes large in a portion except connection portion 14. By keeping a sufficient distance between the end of the insulation layer 12 and the external terminal 20a for conducting large current and the signal terminal 20b for signal transmitting, as a resulting of improving fluidity of the resin 2 in molding formation, productivity are able to be improved.

The salient 4 is provided with the power module mounting portion 3 coinciding with the exposed shape of the radiation layer 13 exposed to the reverse side surface of power module 1. The power module 1 makes surface contact through the grease 17 having high thermal conductivity and is fixed to the power module mounting portion 3. Such structure is capable of insuring radiation path from the reverse side surface of the power module 1 to the module mounting portion 3.

Additionally, instead of the grease 17, a high thermal conductivity radiation sheet and silicon adhesion agents may be used.

Figure 6:
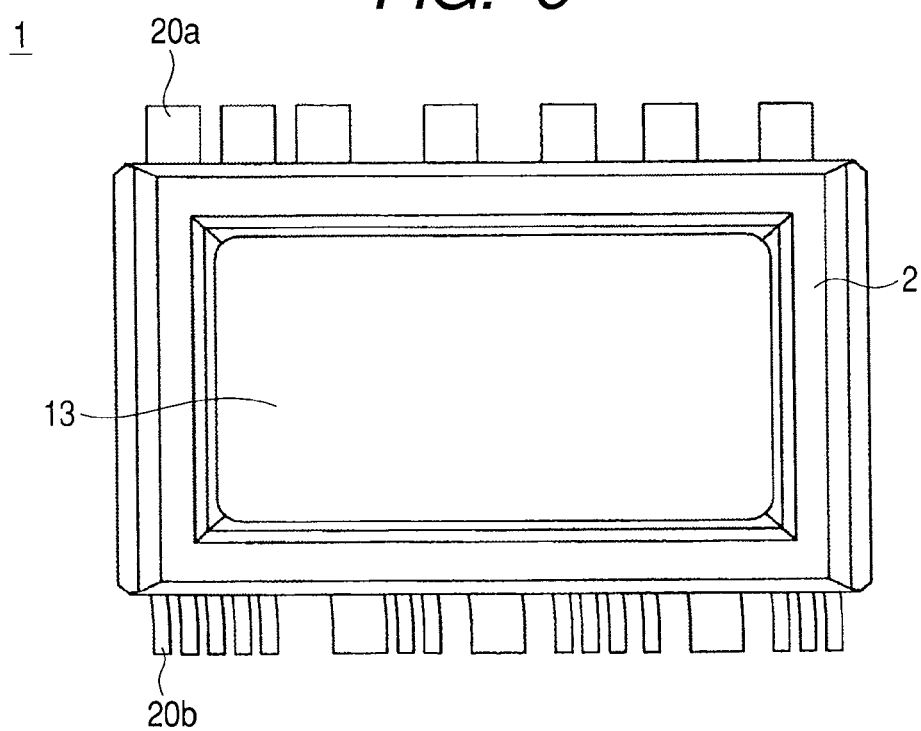
FIG. 6 is a back view showing power module in the second embodiment.

FIG. 6 shows the power module of the second embodiment in accordance with the present invention.

In the power module 1 of the present embodiment, all of the both ends of the longer sides and both ends of the shorter sides of the heat radiation layer 13 are sealed by the resin 2 in reverse side surface of the heat radiation layer 13. In the structure of the first embodiment, only both ends of the longer sides of the heat radiation layer 13 are sealed with the resin 2. As shown in the present embodiment, both ends of the longer sides and both ends of the shorter sides, that is, by sealing all of four sides with the resin 2, it is capable of keeping the heat radiation path and preventing warps of all the power modules 1 efficiently. As a result, provision of the power module with more improved reliability may be possible.

Figure 7:
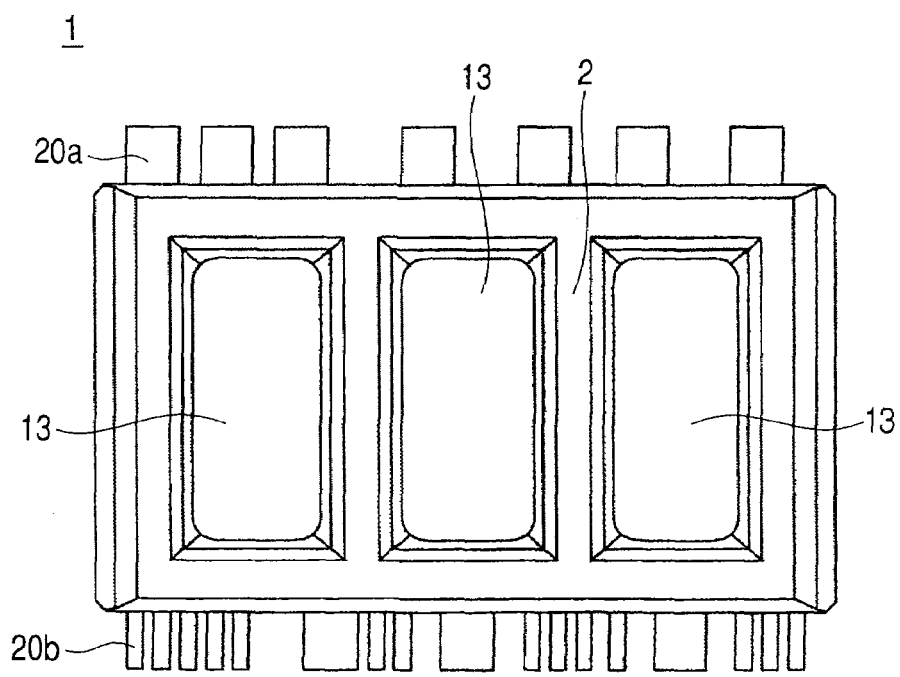
FIG. 7 is a back view showing the power module in the third embodiment.

FIG. 7 shows a power module of the third embodiment in accordance with of the present invention.

In the power module 1 of the present embodiment, in the reverse side surface of the heat radiation layer 13, same as the second embodiment, not only all four sides of the heat radiation layer 13 is sealed with the resin 2 but also the central portion has a resin sealing portion. Such structure may minimize exposure of the heat radiation layer 13 to allowable minimum and may insure radiating heat performance and reliability, At this time, for radiating heat efficiently, a structure is preferable that the switching element 10 is mounted on upper portion of exposure region of the heat radiation layer 13. Therefore, the resin 2 of the central portion is preferable to seal so as to avoid the mounting region of the switching elements 10.

Figure 8:
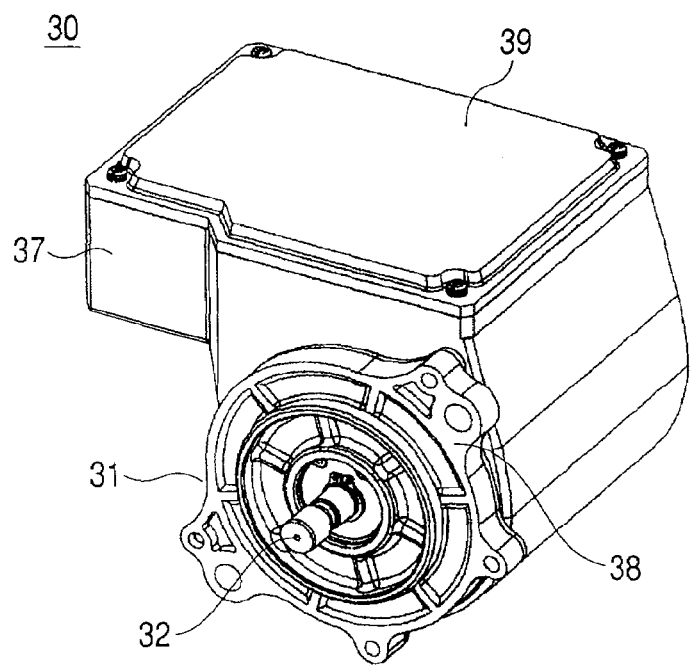
FIG. 8 is a view showing the appearance of the motor integrated control unit mounting the power module in the first embodiment.
Figure 9:
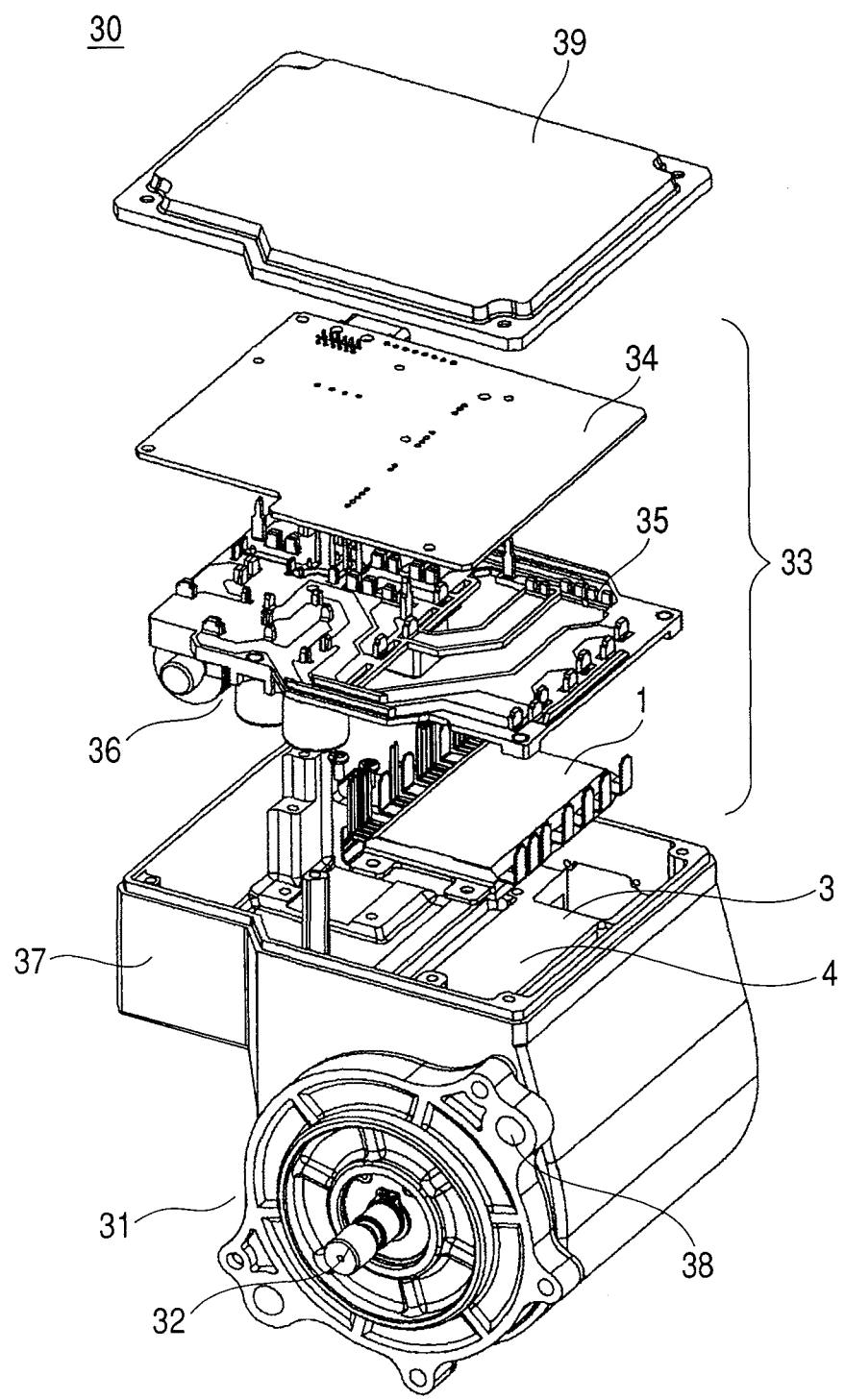
FIG. 9 is a view showing the disassembled motor integrated control unit.

FIG. 8 is an appearance view of a motor integrated control unit mounting the power module 1 in the present embodiment and FIG. 9 is a disassembling view of the motor integrated control unit of FIG. 8.

The motor integrated control unit 30 is used, for example, as a control system of an electric power steering. The motor integrated control unit 30 mainly comprises a motor 31, a motor control unit 33 for driving and controlling the motor 31, a housing 37 accommodating these and a cover 39 closing an opening of the housing 37. A motor shaft 32 (rotating shaft) is projected from the motor 31, and a back-up flange portion 38 is fixed around the motor shaft 32.

The motor control unit 33 is disposed in the housing 37 parallel to the motor shaft 32 of the motor 31 (around rotating shaft). The motor control unit 33 comprises a resin circuit board 34 mounting a micro-computer for controlling driving power of the motor 31, a bus bar wiring board 35 having a path for supplying large current to the motor 3, the power module 1 for flowing the large current to drive the motor 31 based on the control signal from a resin circuit board 34, and a passive parts 36 including power module 1 flowing large current, power source relay, motor relay, coil, capacitor and the like.

The resin circuit board 34, bus bar wiring board 35 and the power module 1 are aligned in order from the opening in the housing 37 towards its bottom. The power module 1 is mounted on the power module mounting portion 3 positioned at the upper portion of the motor 31. The external terminal 20a for conducting large current of the power module 1 is connected to the bus bar wiring board 35 provided at the upper portion of the power module 1. An external terminal 20b for conducting signal of power module 1 is connected to the resin circuit board 34 provided at the upper portion of the bus bar wiring board 35.

The power module 1 is mounted on the power module mounting portion 3 close to the motor 31 of housing 37 and the power module mounting portion 3 is disposed as a portion of the housing 37.

The power module 1 is covered with the resin 2 and has a plurality of switching elements 10 for driving the motor 31 inside the resin. The plurality of switching elements 10 are disposed on the radiation layer 13 though an insulation layer 12 and the radiation layer 13 has an exposure region exposed to outside and a non-exposure region covered with the resin 2. The heat radiation layer 13 is connected to the power module mounting portion 3 in the exposure region. The non-exposure region covered with the resin 2 is placed at the end of the heat radiation layer 13.

In the module mounting portion 3, a salient 4 is provided coinciding with the exposure shape of the radiation layer 13 of the reverse side surface of the power module 1. Accordingly, it is able to diffusing and radiating heat of the switching element 10 to bottom of the housing 37 of the reverse side surface of the power module 1 with high efficiency.

As above described, for radiating heat from the power module 1 efficiently through the housing 1, the power module 1 is positioned between the bus bar wiring board 35 and the motor 31.

Also, to decrease influence of large current for driving the motor 31 on the control signal, a resin circuit board 34 on which a micro computer for generating a control signal is disposed at the upper portion of the power module 1 and the bus bar wiring board 35. As a results the power module 1 and the bus bar wiring board 35 are positioned between the motor 31 and the resin circuit board 34.

In addition, passive portions 36 have a large capacitor, coil or the like to smooth voltage variation and form a voltage rising circuit. Therefore, by placing the passive parts 36 near the bus bar wiring board 35, miniaturization of the motor integrated control unit 30 is realized.

Figure 10:
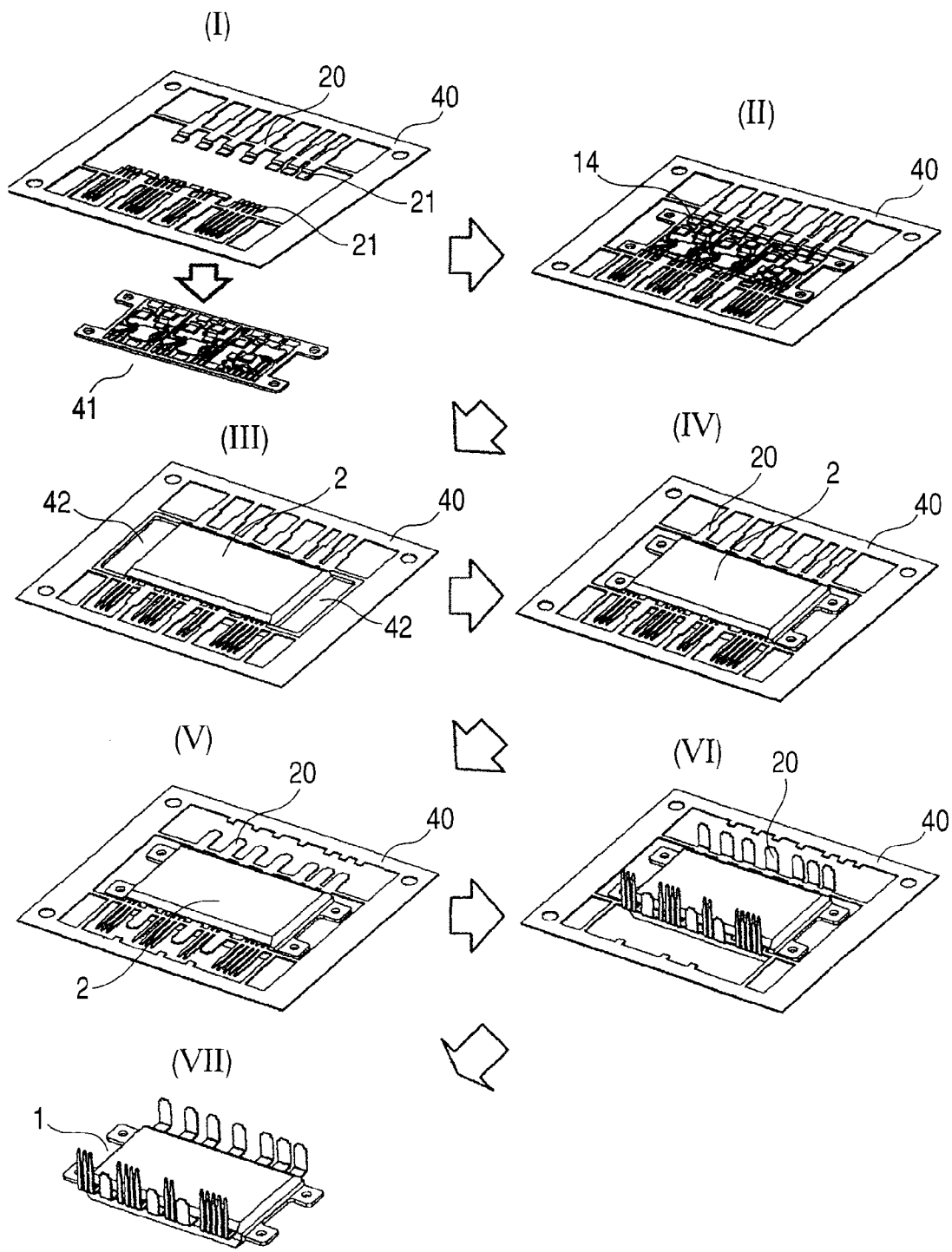
FIG. 10 is a general view showing manufacturing process of the power module in the first embodiment.

FIG. 10 is a general view showing manufacturing process of the power module in the present embodiment. The power module 1 is made through the manufacturing processes shown in [I]-[VII].

In the process [1], lead free solder paste is printed on a metal board which the wiring portion for current 11 comprising a cupper alloy material of wiring thickness of 175 μm, an insulation layer 12 comprising an epoxy resin material and a radiation layer 13 composed of a tough pitch cupper are laminated. An external terminal 20 with a terminal frame 40 manufactured beforehand by press working of a cupper alloy plate mounting a sub-module mounting having a semi-conductor element such as a plurality of switching element 10, a current sensing resistance element 18, a temperature sensing element 19 and the like is mounted on solder paste of a wiring portion for current circuit. In addition, a step portion 21 is made at the press working beforehand.

In the process [II], to carry out soldering on the sub-module 41 of previous process solder, it is inserted to a re-flow furnace. After soldering process, stain of the surface of the sub-module 41, residue of flux material or the like included in solder are cleaned with solvent cleaning or plasma cleaning. Also, a partial electrode of the switching elements 10 and the wiring portion for current circuit are connected by alumna bonding.

In the process [III], the sub-module 41 of previous process is set in a die of an injection-molding machine and the sub-module 41 is sealed with the resin 2 of epoxy thermo-setting type and taken out of the die.

In the process [IV], unnecessary resin portion (resin burrs) 42 formed around peripheral portion of sub-module 41 in resin sealing process is removed.

In the process [V], a part of external terminal 20 and a terminal frame 40 mounted on the sub-module 41 of the previous process is cut out by pressing.

In the process [VI], the external terminal 20 mounted on the sub-module 41 of the previous process is bended to L-shape by press working.

In the process [VII], the external terminal 20 and the terminal frame 40 mounted on the sub-module 41 of the previous process are cut out by press working.

As described above, according to the present embodiment, it is able to provide a power module with improved reliability and productivity with keeping the heat radiation path.

As more concretely explained, according to the present embodiment, not only the upper surface and side surface of the power module 1 where a plurality of the switching elements are mounted but also at least a part of the heat radiation layer 13 placed at the reverse side surface of the power module 1 is exposed or sealed partially with thin resin, and sealed with the hardening type resin 2 so as to be plane different from the reverse side surface of the power module 1 in height.

Such structure may decrease the difference of quantity of expansion and shrinking of the resin disposed on upper and lower surfaces of the power module 1, as a result, it is able to suppress entire warp of the power module due to hardening and shrinking by resin hardening during manufacturing of the power module 1, resin shrinking at cooling and expansion and shrinking at ambient temperature in the practical use. As a result, it is able to keep the heat radiation path and provide a power module 1 with high reliability.

As above, some embodiments in accordance with the present invention are concretely explained. The present invention, however, is not limited to the above embodiments and appropriately changes may be allowed within the spirit of the present invention.

For example, in the first embodiment, explained is the structure which all of both ends of the longer sides of reverse side surface of the power module 1 are covered with the resin 2. Without limiting this, it is able to adopt a structure in which a portion of both ends of the longer sides is exposed and partially covered with the resin 2. This may be applicable to the second and third embodiments as same way. If a portion of the reverse side surface of the radiation layer 13 is exposed so as to keep the heat radiation path, there is no limiting the shape of the sealing resin 2.

Also, the embodiments in accordance with the present invention are explained as an assumption that the switching elements 10 be a bear chip. Instead, it is able to mount the switching elements sealed with resin beforehand.

According to the present invention, it is able to propose a power module with improved reliability.

What is claimed is:

1. A power module comprising:
    a heat radiation layer having a first main surface, and a second main surface on the opposite side of said first main surface,
    an insulation layer being disposed on said first main surface of said heat radiation layer,
    a wiring portion of current circuit disposed on said insulation layer,
    a plurality of switching elements disposed on said insulation layer and electrically connected to said wiring portion for circuit current,
    a plurality of external terminals electrically connected to said wiring portion of current circuit,
    a resin to seal all of said insulation layer, said wiring portion of current circuit, said switching elements and said first main surface of said heat radiation layer, and a portion of said second main surface of said radiation layer.

2. A power module according to claim 1, wherein portion except region sealed by said resin in said second main surface of said heat radiation layer has an exposure region exposed to the outside of said heat radiation layer.

3. A power module according to claim 2, wherein the surface of said resin sealing the surface of said second main surface of said heat radiation layer and said second main surface differs from each other in its height.

4. A power module according to claim 3, wherein said switching elements are mounted on upper portion of the exposure region of said heat radiation layer.

5. A power module according to claim 4, plane shape of said heat radiation layer is rectangular and at least a portion of the four sides of said second main surface in said heat radiation layer is sealed with said resin.

6. A power module according to claim 5, wherein both ends of the longer sides in the four sides of said second main surface of said heat radiation layer is sealed by said resin.

7. A power module according to claim 5, wherein all of the both ends of the longer sides and shorter sides of said second main surface of said heat radiation layer are sealed by said resin.

8. A power module according to claim 5, wherein the both ends of the longer sides and shorter sides of said second main surface of said heat radiation layer and a portion inside of said second main surface are sealed with said resin.

9. A power module according to claim 5, wherein said heat radiation layer is composed of a cupper alloy material.

10. A power module according to claim 5, wherein said external terminal has a step portion at a connection portion to said wiring portion for current circuit.

11. A power module according to claim 5, wherein said switching elements have a surface electrode pad and a reverse side surface electrode pad, and the reverse side surface electrode pad of said switching elements is connected to the wiring portion of current circuit with lead free solder.

12. A power module according to claim 5, wherein said plurality of external terminals include a first terminal for flowing current to drive a motor, and a second terminal for transmitting a control signal,
    the width of the first terminal being larger than that of the second terminal.

13. A power module according to claim 12, wherein at least a portion of surface electrode pad of said switching elements are connected to said wiring portion of current circuit through a conductive stripe shaped bridge member with the lead free solder.

14. A power module according to claim 12, wherein said insulation layer is composed of aluminum oxide.

15. A power module according to claim 12, wherein said wiring portion of current circuit is composed of a wiring portion of current circuit having a cupper alloy material with thickness of over 100 μm.

16. A power module according to claim 1, wherein the thickness of said resin sealing said second main surface of said heat radiation layer differs from between the central portion of said second main surface and its peripheral portion, said resin sealing the central portion is thinner than that of the peripheral portion.

* * * * *